United States Patent [19]

Schuenemann et al.

[11] 4,023,147

[45] May 10, 1977

[54] ASSOCIATIVE CAPACITIVE STORAGE CIRCUITS

[75] Inventors: Claus Schuenemann, Schoenaich; Frank Tsui, Holzgerlingen, both of Germany

[73] Assignee: International Business Machines Corporation, Armonk, N.Y.

[22] Filed: Oct. 6, 1975

[21] Appl. No.: 620,481

[30] Foreign Application Priority Data

Nov. 16, 1974 Germany .......................... 2454427

[52] U.S. Cl. ....................... 340/173 CA; 307/205; 307/238; 340/166 R
[51] Int. Cl.² ....................................... G11C 11/02
[58] Field of Search ............. 340/173 AM, 173 CA, 340/166 R; 307/205, 231, 238, 251

[56] References Cited

UNITED STATES PATENTS

| | | | |
|---|---|---|---|
| 3,387,286 | 6/1968 | Dennard | 340/173 CA |
| 3,750,115 | 7/1973 | Mundy | 340/173 AM |
| 3,774,176 | 11/1973 | Stein et al. | 307/238 |
| 3,909,631 | 9/1975 | Kitagawa | 307/238 |

Primary Examiner—Marshall M. Curtis

Attorney, Agent, or Firm—Stephen J. Limanek

[57] ABSTRACT

For associative operation of a storage circuit, two field-effect transistors form one storage cell, i. e. that together with associated capacitors they store either a 1 or a 0. A word line is connected to one electrode of each field-effect transistor in a storage row. At one end of the word line a sensing amplifier with latch characteristics is arranged so that the information sensed by this circuit is amplified and subsequently latched or stored. For the associative operation of the circuit arrangement, two query lines Q0 and Q1 are provided for a bit position. When only one field-effect transistor with a series-connected capacitor is used, the bits of one bit position of the various words are simultaneously written, and the bit positions are addressed one after the other. For a bit position which is queried by means of a key or an identifier word bit "1" the true value of the bit is applied. For a bit position which is queried by means of a key or an identifier word bit "0" the complement of the bit is applied. Querying is effected in that lines Q of all bit positions to be queried are set to $V_n$. Only when the key or identifier word and the queried bits concur with each other in full does no signal occur on the word line.

4 Claims, 8 Drawing Figures

ASSOCIATIVE CAPACITIVE STORAGE CIRCUITS

FIELD OF THE INVENTION

The invention relates to an associative storage using field-effect transistors with a series-connected capacitor for the actual information storage.

DESCRIPTION OF THE PRIOR ART

An associative storage for storing digital data differs from a non-associative storage in that in the latter a data word is addressed by specifying the address of the storage cell, whereas in an associative storage a data word is addressed by specifying at least a part of a key word and the word contents, respectively. An associative storage of this kind is described in principle, for example, on page 653 of the "Taschenbuch der Nachrichtenverarbeitung" by K. Steinbuch. In the usual associative storage the search word is entered into the bit positions of an input register which corresponds with the bit positions of the key words in storage, the search word being subsequently compared with the key words either parallely or in series. The data words corresponding with the search words at the respective bit positions are marked and then read one-by-one into an output register. As in associative storages a so-called search operation is performed which is directly connected with a compare operation, an associative storage cell should generally permit this search operation without the stored contents being detrimentally affected or destroyed.

A storage cell suitable for this purpose and capable of assuming three stable states is described in U.S. Pat. No. 3,543,296. However, this storage cell requires a large number of components. To reduce the number of components involved, United Kingdom Patent 1,281,387 proposes an associative storage cell consisting of at least one single-emitter transistor which is directly cross-coupled to a double-emitter transistor. This storage cell can be set to a so-called X-state when the single-emitter transistor is conductive. The latter patent furthermore proposes that the associative storage cells be made up of two directly cross-coupled double-emitter transistors. However, this concept, also, is very elaborate. In addition, these circuits have the disadvantage that the match signal during the search operation is subjected to considerable noise, so that excessive demands are made on the read amplifiers.

U.S. Pat. No. 3,725,879 proposes a further associative storage cell which does not comprise double-emitter structures and which is characterized in that the base of one cross-coupled transistor is connected to the emitter of a transistor whose collector and base are linked to the word search line and the search read line, respectively. However, this storage cell requires a large number of components.

In non-associative storages, i.e., storages addressed by means of X-Y addresses, the so-called capacitive single-FET storage cell has been gaining ground because it requires extremely little space in integrated technology. This storage cell is disclosed in U.S. Pat. No. 3,387,286. In accordance with the teaching of this patent, each storage cell includes one field-effect transistor and one capacitor which is connected to the source of the field-effect transistor. The gate electrode is connected to the word line, the source terminal to the bit line, and the carrier layer terminal to a reference voltage source. The bit line is used as a sense line during reading. This storage cell has the advantage that it requires very little space in integrated technology and that in spite of the regeneration of the storage contents resulting from a decrease in the capacity, the read-write cycles are in the range of 120 nanoseconds.

SUMMARY

It is an object of this invention to provide an associative storage comprising field-effect transistor storage cells with a series-connected capacitor in such a manner that the reduced space requirements of known storage cells of this type are maintained during associative operation.

The advantages of existing storage levels with capacitive single-FET storage cells are retained when used as associative storages. In addition, the small size of the storage cell thus obtained exceeds that previously considered feasible for this type of cell.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1A:
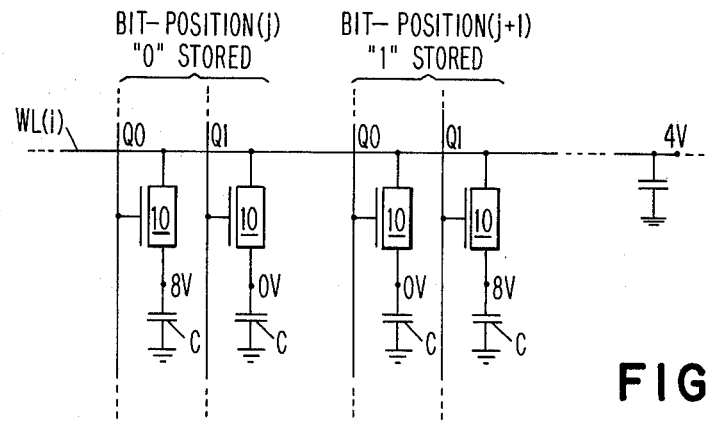
FIG. 1A is a circuit diagram of one embodiment of the cell arrangement.
Figure 1B:
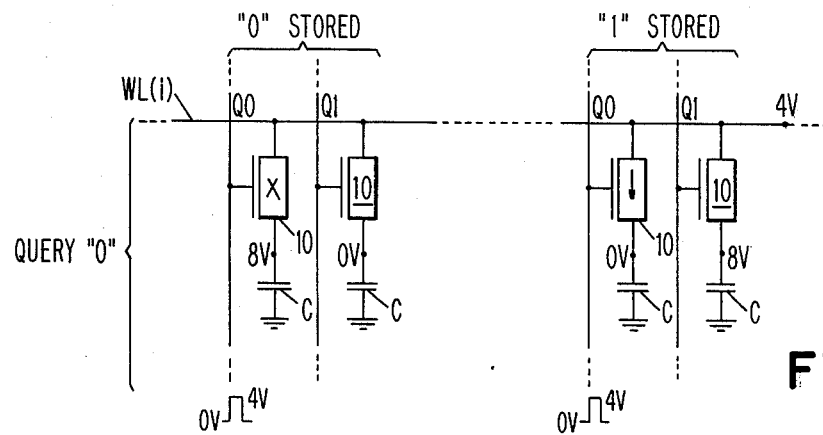
FIG. 1B is a circuit diagram of the cell arrangement with an indicatin of a query for "0"
Figure 1C:
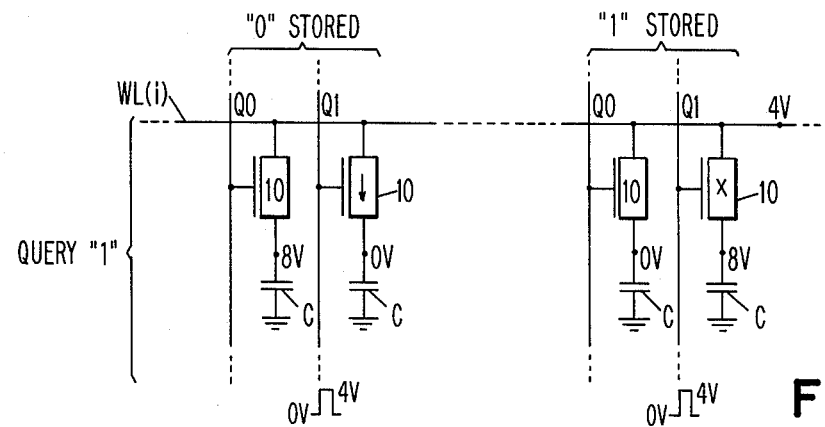
FIG. 1C is a circuit diagram of the cell arrangement with an indication of a query for "1"

The circuit shown in FIGS. 1A, 1B and 1C is a section of a storage whose cells are made of integrated field-effect transistors 10, each of which is series-connected to one capacitor C. For the associative operation of this storage, two field-effect transistors form one storage cell, i.e., that together with the associated capacitors they store either a 1 or a 0. As will be seen from the circuit, word line WL(i) is linked with one electrode of each field-effect transistor in a storage row. At the end of this word line WL(i) a sensing amplifier with latch characteristics, which is known per se but not shown, is arranged, so that the information sensed by this circuit is amplified and subsequently latched or stored. For the associative operation of the circuit arrangement of FIGS. 1A, 1B and 1C, two query lines Q0 and Q1 are provided for one bit position (j). Thus the two left field-effect transistors in FIG. 1A form one storage cell and the two right field-effect transistors form another storage cell for bit position (j+1).

It is assumed that on the node between the field-effect transistors 10 and the capacitors C, 8 volts are available for bit position (j) in the case of the left field-effect transistor and 0 volts on the node of the right field-effect transistor for the same bit position. In the present example, this indicates that the storage cell contains a 0. The nodes of the two transistors of bit position (j+1) are inversely charged, i.e., 0 volts is applied to the node of the left field-effect transistor and 8 volts are applied to the node of the right field-effect transistor, which corresponds to a stored 1. For storing one bit the circuit arrangement of FIG. 1A requires two transistors to prevent the stored information from being destroyed during searching and reading.

Before each search operation by means of the query lines Q0 and Q1, the word lines WL(i) are made to adopt a neutral potential $V_n$ which in the present case is about 4 volts. This is equal to half the potential $V_c$ minimum, which corresponds to the minimum potential on a capacitor for a stored 1.

For a search operation at one bit position with a key or an identifier word of 0 and 1, respectively, the corresponding query line Q0 or Q1 is pulsed to the potential $V_n$. Only if a 1 is stored and the query bit is a 0, or if a 0 is stored and the query bit is a 1, does one of the field-effect transistors associated with the cell become conductive, thus discharging the word line. The resulting drop in the potential on word line WL(i) indicates that the queried word at this bit position does not match the key or identifier word. If on the other hand the stored word and the word to be queried match the key or identifier word, then no voltage drop occurs on the associated word line WL(i). The sensing amplifier, previously mentioned but not shown, detects whether the word line potential has or has not dropped, the connected latch circuit being set accordingly. As shown in FIGS. 1B and 1C, a pulse changing from 0 to $V_n$ (4 volts) is applied to query line Q0 or Q1 to query a "0" and a "1", respectively. The small crosses and arrows in transistors 10 indicate the state of the transistors during querying, the small crosses indicating the off state and the arrows a discharge of the word line, i.e., a current flow through the corresponding field-effect transistor 10 to the capacitor C.

After searching the original charge for the capacitors of the queried half of the storge cells, the cells have to be restored. This is effected in two cycles for each bit position: one cycle for reading the stored contents from the non-queried half of the cell and another cycle for rewriting the information into the cell. For an associative storage arrangement with W words for B bit positions and up to two times 2×B FET transistors and capacitors 2×B cycles are required for rewriting.

To reduce this time by one half, a further embodiment of the storage cell arrangement will be described below by means of FIGS. 2A, 2B and 2C. As in FIGS. 1A, 1B and 1C the circuit of FIGS. 2A, 2B and 2C use two transistors per bit position for associative storage, but the storage of FIGS. 2A, 2B and 2C comprises three vertical lines B, Q and P for each bit column. Line B is used for reading and writing the left cell half, line Q for querying, reading and rewriting the right half, and line P for pulsing. In contrast to the circuit of FIGS. 1A, 1B and 1C identical potentials, e.g., 0 volts for "0" or 8 volts for "1", are applied to the nodes of the two storage cell halves.

Normally, lines B, Q and P are at a 0 volt level. Before querying, the corresponding word line is pulsed to $V_n$, in the present case to 4 volts. During querying, line Q is pulsed to 1.5 × $V_n$, which in the case of the embodiment of FIGS. 2A, 2B and 2C corresponds to a voltage of 6 volts. In the present example line P is driven to $+V_n$ or 4 volts when the key or identifier word bit is "0" or to $-V_n$ equalling $-4$ volts when the key or identifier word is "1". Care is to be taken that pulsing for 0 and 1 querying takes place at separate times. As will be seen from FIGS. 2B and 2C, the word line remains at $V_n$ when the stored bit and the corresponding bit of the key or identifier word concur, whereas in the case on nonconcurrence, a positive or a negative signal occurs on the word line. The sensing amplifier, not shown, on word line WL(i) receives the concurrence or nonconcurrence signal, adjusting itself or the connected latch circuits, not shown, accordingly. For regenerating the storage cell after querying, the non-queried left half of the cell is read first. By pulsing line Q the right storage cell field-effect transistor is turned on, in order to charge or discharge the right and the left capacitor concurrently via the sensing amplifier not shown. Regeneration of the left cell and rewriting of the right cell may be effected in the same cycle. The circuit of FIGS. 2A, 2B and 2C thus permits carrying out the necessary regeneration operations in an associative storage arrangement in only B cycles.

Figure 3:
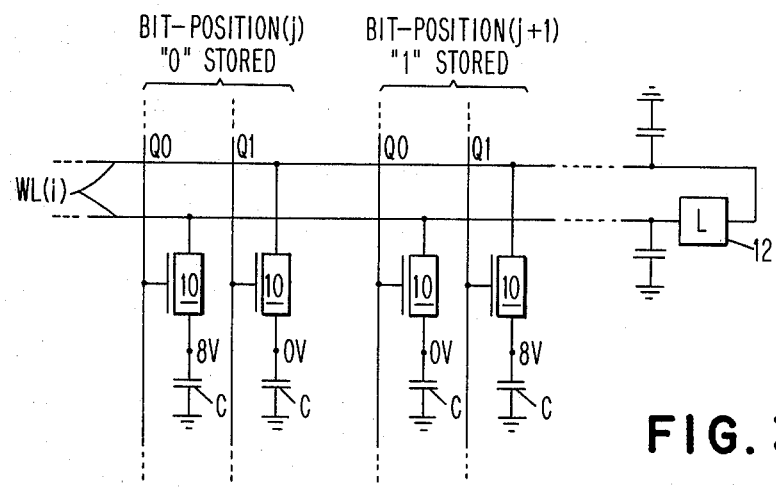
FIG. 3 is a further embodiment of the associative storage using two word lines.

FIG. 3 shows a further embodiment of an associative storage which uses two field-effect transistors with series-connected capacitors for storing one bit.

As will be seen from the left storage cell in FIG. 3, the nodes between the capacitors C and field-effect transistors 10 have the following potentials when a 0 is stored in a storage cell: the node on the left has a potential of 8 volts and the node on the right a potential of 0 volts. For a stored 1, as shown in the case of the right storage cell in FIG. 3, the left node carried 0 volts and the right node 8 volts. In contrast to the circuit arrangements of FIGS. 1A, 1B and 1C and 2A, 2B and 2C the two field-effect transistors associated with a storage cell are not connected to a common word line but to two word lines WL(i) forming a pair. In addition, the control electrode of each field-effect transistor is connected to a query line, viz., query line Q0 or Q1.

Furthermore, the two above-mentioned word lines WL(i) are connected to two different terminals of a latch type sensing amplifier 12.

Figure 2A:
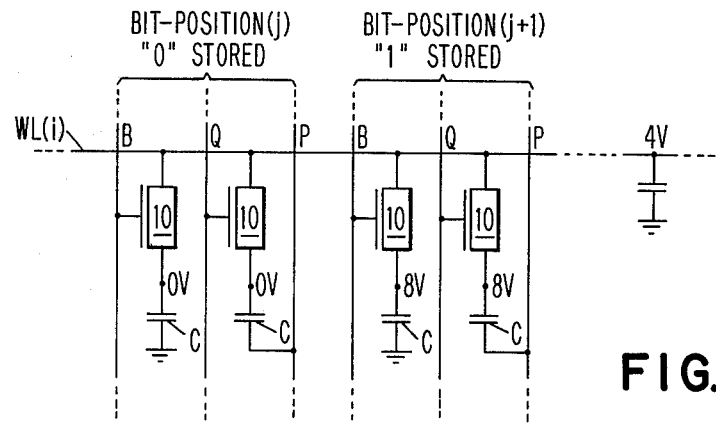
FIG. 2A is a second embodiment of the circuit arrangement by means of which the time required for rewriting data is halved.
Figure 2B:
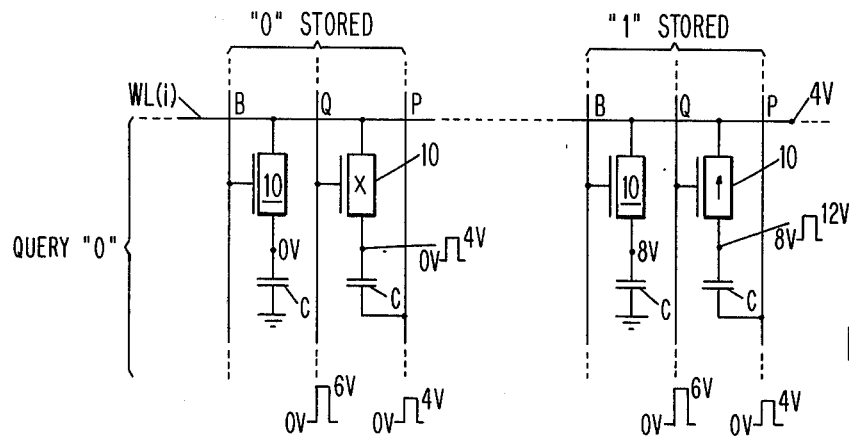
FIG. 2B is the arrangement of the second embodiment with an indicatin of a query for "0"
Figure 2C:
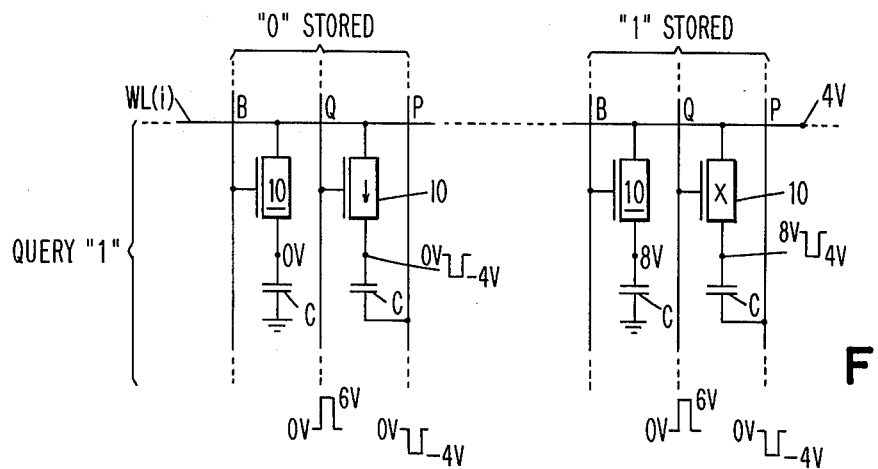
FIG. 2C is the arrangement of the second embodiment with an indication of a query for "1"

Similar to FIGS. 1A, 1B and 1C, searching is carried out in that either line Q0, whenthe key or identifier word bit is "0", or line Q1, when the key or identifier bit is "1", is pulsed to $V_n$, and as in the circuits of FIGS. 2A, 2B and 2C, lines Q0 and Q1 are pulsed at different times. Regeneration after a search operation can be effected by the latch type sensing amplifier 12 connected to the two word lines complementarily driving the latter. Of each cell the non-queried cell half is read first and then the two cell halves are written back.

Figure 4:
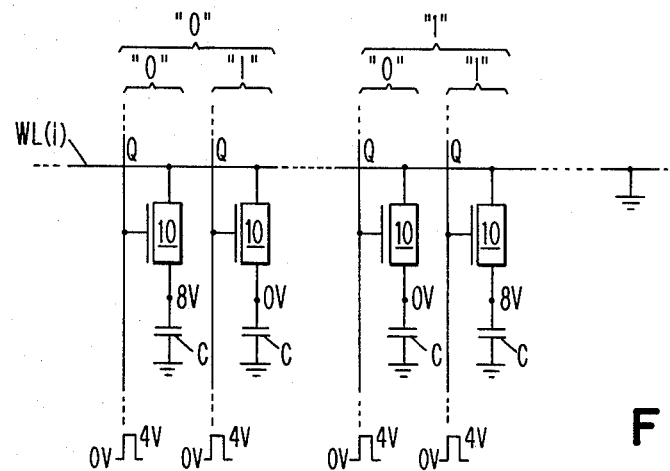
FIG. 4 is another embodiment utilizing only one field-effect transistor for a stored bit.

It has been found that in some cases one and the same key or identifier word is used for querying, so that it is not necessary to rewrite information for regenerating the storage contents after the cells have been queried. In these cases it is possible, also during associative operation, to use one storage cell with only one field-effect transistor and a series-connected capacitor for a stored bit. Such a concept is shown in FIG. 4.

To permit using only one field-effect transistor 10 with a series-connected capacitor C per bit in an associative storage arrangement, it is necessary to employ a special method for writing data into storage. The bits of one bit position of the various words are simultaneously written and the bit positions are subsequently addressed one after the other. For a bit position which is queried by means of a key or an identifier word bit "1" the true value of the bit is applied. For a bit position which is queried by means of a key or an identifier word bit "0" the complement value of the bit is applied. Querying in accordance with FIG. 4 is effected in that lines Q of all bit positions to be queried are set to $V_n$. Only when the key or identifier word and the queried bits concur with each other in full does no signal occur on the word line. This state is evaluated by the connected sensing amplifier, not shown. It is pointed out that a word can also be written into storage by X-Y, rather than associatively, addressing the word line. The addressed word line is sequentially loaded with "1" and "0", i.e., 8 volts and 0 volts, and the key and/or identifier word bits "1" and "0" are fed to query lines Q1 and Q0 in the same sequence.

While the invention has been particularly shown and described with reference to preferred embodiments thereof, it will be understood by those skilled in the art that various changes in form and details may be made therein without departing from the spirit and scope of the invention.

What is claimed is:

1. An associative storage circuit comprising
   a word line,
   a plurality of cells coupled to said word line, each of said cells comprising
      a first capacitive storage circuit including a field-effect transistor having first and second current carrying electrodes and a gate electrode, and
      a capacitor serially connected with said transistor at said first electrode, said second electrode being connected to said word line,
   a plurality of query lines, one of said lines being connected to a respective one of each of said gate electrodes,
   means for simultaneously applying an identifier word bit pulse to each of said query lines, and
   means for detecting voltage changes on said word line.

2. An associative storage circuit as set forth in claim 1 wherein each of said cells further includes a second capacitive storage circuit connected to said word line.

3. An associative storage circuit as set forth in claim 1 wherein said first circuit further includes means having a line connected to said capacitor for applying a voltage pulse thereto, said capacitor being disposed between the line of said means and said first electrode, and
   wherein each of said cells further comprises a second capacitive storage circuit including a second transistor having a gate electrode and first and second current carrying electrodes and a second capacitor connected between the first electrode of said second transistor and a point of fixed potential, the second electrode of said second transistor being connected to said word line, and means for applying a voltage pulse to the gate electrode of said second transistor.

4. An associative storage circuit as set forth in claim 2 wherein said word line has first and second segments and said detecting means is a latch-type amplifier providing complementary output voltages at first and second terminals, said first segment being connected to said first terminal and said second segment being connected to said second terminal, and wherein each of said first capacitive circuit is connected to said first segment and each of said second capacitive circuit is connected to said second segment, the nodes between said transistors and said capacitors having different voltage magnitudes.

* * * * *